United States Patent
Liu

(10) Patent No.: US 10,796,643 B2
(45) Date of Patent: Oct. 6, 2020

(54) AMOLED DISPLAY PANEL WITH TRANSMITTING GOA CIRCUIT DISPOSED BELOW EFFECTIVE DISPLAY REGION

(71) Applicant: Wuhan China Star Optoelectronics Semiconductor Display Technology Co., Ltd., Wuhan (CN)

(72) Inventor: Changyu Liu, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 16/041,854

(22) Filed: Jul. 23, 2018

(65) Prior Publication Data

US 2019/0237022 A1 Aug. 1, 2019

Related U.S. Application Data

(63) Continuation of application No. PCT/CN2018/079550, filed on Mar. 20, 2018.

(30) Foreign Application Priority Data

Jan. 30, 2018 (CN) .......................... 2018 1 0092373

(51) Int. Cl.
G09G 3/36 (2006.01)
G09G 3/30 (2006.01)
G09G 3/3266 (2016.01)
H01L 27/32 (2006.01)
G09G 3/3225 (2016.01)

(52) U.S. Cl.
CPC ......... *G09G 3/3266* (2013.01); *G09G 3/3225* (2013.01); *H01L 27/3244* (2013.01); *G09G 2300/0408* (2013.01)

(58) Field of Classification Search
CPC .. G09G 2300/04–0434; G09G 2300/08–0895; G09G 2310/0264–0297; G09G 2300/0408
See application file for complete search history.

(56) References Cited

U.S. PATENT DOCUMENTS

2009/0184914 A1 7/2009 Han et al.
2014/0184479 A1 7/2014 Wu
(Continued)

FOREIGN PATENT DOCUMENTS

CN 102903732 A 1/2013
CN 104409038 A 3/2015
(Continued)

*Primary Examiner* — Sanghyuk Park

(57) ABSTRACT

An AMOLED display panel is disclosed. The display panel comprises a GOA circuit and an effective display region. The GOA circuit comprises a transmitting GOA circuit, and the transmitting GOA circuit is disposed below the effective display region and is completely covered by the effective display region. In this way, the present disclosure disposes the transmitting GOA circuit below the effective display region, and the left and the right sides outside the effective display region do not need to be provided with the transmitting GOA circuit, thereby remarkably reducing the width of the left and the right bezels of the AMOLED display panel.

6 Claims, 4 Drawing Sheets

(56) References Cited

U.S. PATENT DOCUMENTS

| | | | |
|---|---|---|---|
| 2016/0329021 A1 | 11/2016 | Nagayama et al. | |
| 2016/0379571 A1 | 12/2016 | Kim et al. | |
| 2017/0047038 A1* | 2/2017 | Noma | G02F 1/1368 |
| 2017/0092698 A1 | 3/2017 | Zou | |
| 2017/0255049 A1* | 9/2017 | Nishiyama | G02F 1/13454 |
| 2017/0270886 A1 | 9/2017 | Yu | |
| 2017/0330512 A1 | 11/2017 | Zhou | |
| 2018/0113564 A1* | 4/2018 | Takahashi | G06F 3/0416 |
| 2018/0190747 A1* | 7/2018 | Son | G06F 3/1446 |

FOREIGN PATENT DOCUMENTS

| | | |
|---|---|---|
| CN | 104517564 A | 4/2015 |
| CN | 104680967 A | 6/2015 |
| CN | 105139801 A | 12/2015 |
| CN | 106097968 A | 11/2016 |
| CN | 106098698 A | 11/2016 |

\* cited by examiner

AMOLED DISPLAY PANEL WITH TRANSMITTING GOA CIRCUIT DISPOSED BELOW EFFECTIVE DISPLAY REGION

CROSS-REFERENCE TO RELATED APPLICATIONS

This is a continuation of International Application PCT/CN2018/079550, with an international filing date of Mar. 20, 2018, which claims foreign priority of Chinese Patent Application No. 201810092373.4, filed on Jan. 30, 2018 in the State Intellectual Property Office of China, the contents of all of which are hereby incorporated by reference.

TECHNICAL FIELD

The present disclosure generally relates to the field of liquid displaying, and more particularly, relates to an AMOLED display panel.

BACKGROUND

Organic light emitting diode (OLED) display panels have found wide application in smart phones, tablet computers, full-color TVs or the like due to advantages thereof such as self-illumination, a low driving voltage, a high light emitting efficiency, a short response time, high definition and contrast, a viewing angle of nearly 180°, a wide range of using temperature or the like.

OLED display panels may be divided into two categories, i.e., passive matrix (PM) display panels and active matrix (AM) display panels, and the active matrix organic light emitting diode (AMOLED) technology is the key development orientation of flexible displaying.

To achieve the displaying of the AMOLED display panels, a gate drive circuit needs to be disposed on a corresponding backplane. For conventional display panels, a gate drive chip integrated with the gate drive circuit is bonded at the left and the right sides of the panel outside an effective display region. With the development of the displaying technology, a gate drive on array (GOA) circuit has emerged and replaced the conventional gate drive chip to achieve line-by-line scanning drive. However, the display panel currently available still has the GOA circuit disposed at the left and the right sides of the panel outside the effective display region, which does not comply with the development trend of an ultra-narrow bezel of the display panel.

SUMMARY

A primary technical problem to be solved by the present disclosure is to provide an AMOLED display panel, which can reduce the width of the left and the right bezels of the AMOLED display panel.

To solve the aforesaid technical problem, a technical solution adopted by the present disclosure is to provide an AMOLED display panel which comprises a GOA circuit and an effective display region; wherein the GOA circuit comprises a transmitting GOA circuit, the transmitting GOA circuit is disposed below the effective display region and is completely covered by the effective display region; wherein the GOA circuit further comprises a first scanning GOA circuit and a second scanning GOA circuit; wherein the first scanning GOA circuit, the second scanning GOA circuit and the transmitting GOA circuit are disposed in parallel, the first scanning GOA circuit and the second scanning GOA circuit are respectively disposed in edge areas at two sides outside the effective display region or disposed below the effective display region and the first scanning GOA circuit and the second scanning GOA circuit completely covered by the effective display region.

To solve the aforesaid technical problem, another technical solution adopted by the present disclosure is to provide an AMOLED display panel which comprises a GOA circuit and an effective display region; wherein the GOA circuit comprises a transmitting GOA circuit, and the transmitting GOA circuit is disposed below the effective display region and is completely covered by the effective display region.

Benefits of the present disclosure are as follows: the AMOLED display panel of the present disclosure comprises a GOA circuit and an effective display region; wherein the GOA circuit comprises a transmitting GOA circuit, and the transmitting GOA circuit is disposed below the effective display region and is completely covered by the effective display region. In this way, the present disclosure disposes the transmitting GOA circuit below the effective display region, and the left and the right sides outside the effective display region do not need to be provided with the transmitting GOA circuit, thereby remarkably reducing the width of the left and the right bezels of the AMOLED display panel and obtaining a display panel with narrow bezels and a high pixels per inch (PPI).

DETAILED DESCRIPTION

Technical solutions of embodiments of the present disclosure will be described clearly and completely hereinafter with reference to the attached drawings illustrating the embodiments of the present disclosure. Obviously, the embodiments described herein are only a part of but not all of the embodiments of the present disclosure. All other embodiments that can be obtained by those of ordinary skill in the art from the embodiments of the present disclosure without making creative efforts shall fall within the scope of the present disclosure.

Figure 1:
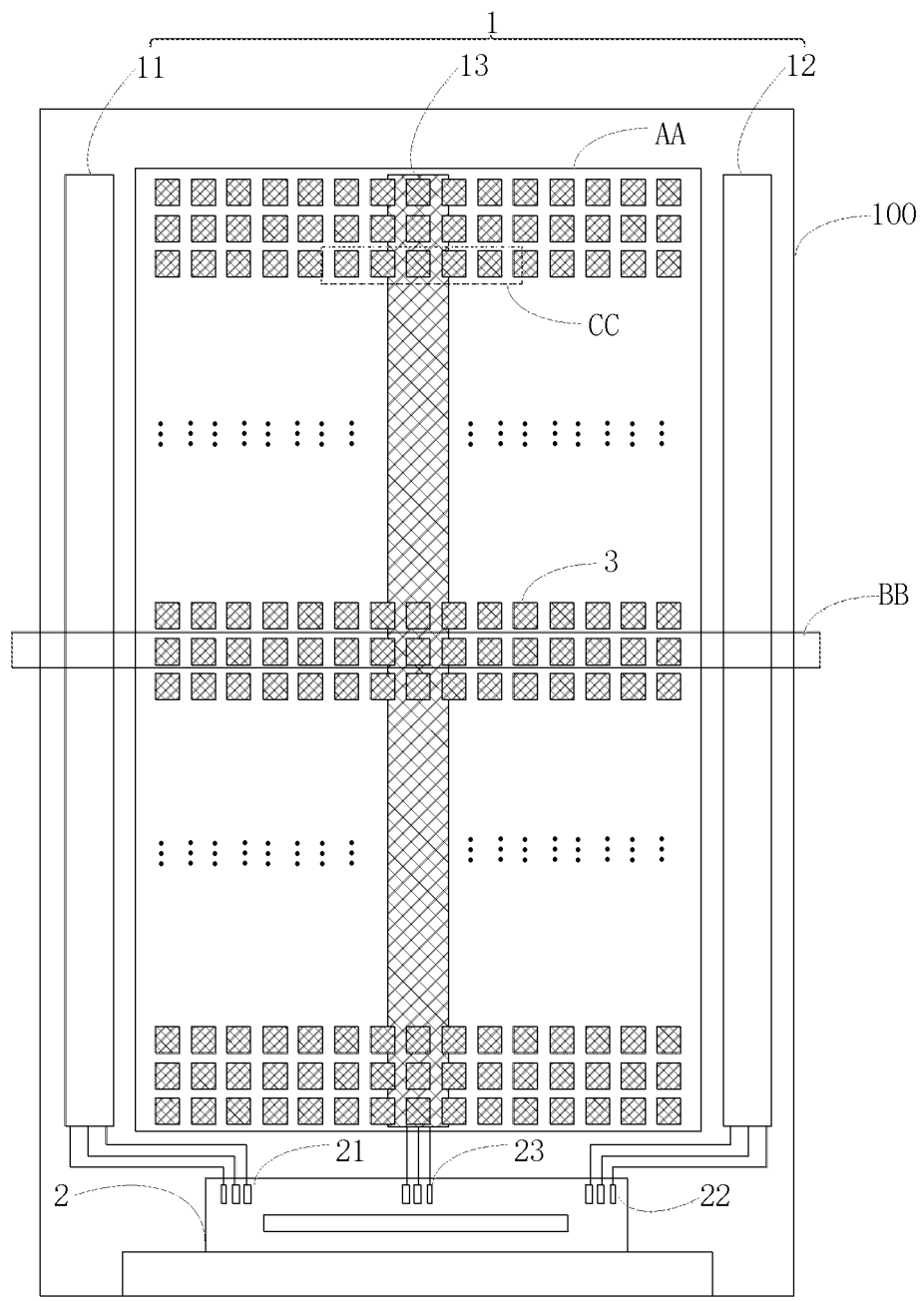
FIG. 1 is a schematic structural view of an AMOLED display panel according to a first embodiment of the present disclosure.

FIG. 1 is a schematic structural view of an AMOLED display panel according to a first embodiment of the present disclosure. As shown in FIG. 1, a display panel 100 may comprise a GOA circuit 1, a drive chip 2 and a pixel unit 3 disposed in an effective display region AA.

The GOA circuit 1 may be formed by a plurality of GOA unit circuits connected in cascade, and each of the GOA unit circuits may drive a row of the pixel unit 3. Specifically, the GOA circuit 1 may comprise a first scanning GOA circuit 11, a second scanning GOA circuit 12 and a transmitting GOA circuit 13.

The transmitting GOA circuit 13 may be disposed below the effective display region AA and may be completely covered by the effective display region AA. In this embodiment, the transmitting GOA circuit 13 and the effective display region AA may be disposed to be rectangular, and a central axis of the transmitting GOA circuit 13 may overlap with a central axis of the effective display region AA.

The first scanning GOA circuit 11, the second scanning GOA circuit 12 and the transmitting GOA circuit 13 may be disposed in parallel, and the first scanning GOA circuit 11 and the second scanning GOA circuit 12 may be respectively disposed in edge may be as at two sides outside the effective display region AA.

In this embodiment, the first scanning GOA circuit 11 and the second scanning GOA circuit 12 may be disposed to be rectangular, and the first scanning GOA circuit 11 and the second scanning GOA circuit 12 may be disposed symmetrically with respect to the central axis of the transmitting GOA circuit 13.

In this embodiment, the first scanning GOA circuit 11, the second scanning GOA circuit 12 and the transmitting GOA circuit 13 may have the same length, and the width of the first scanning GOA circuit 11 and the second scanning GOA circuit 12 may be the same and the width of the first scanning GOA circuit 11 and the second scanning GOA circuit 12 may be smaller than or equal to the width of the transmitting GOA circuit 13.

The drive chip 2 may be disposed substantially perpendicular to the transmitting GOA circuit 13, and the drive chip 2 may be disposed at an edge area outside the effective display region AA.

In this embodiment, specifically, the first scanning GOA circuit 11 may be disposed in a left-side edge area outside the effective display region AA, the second scanning GOA circuit 12 may be disposed in a right-side edge area outside the effective display region AA, and the drive chip 2 may be disposed in a lower-side edge area outside the effective display region AA.

The drive chip 2 may be configured to provide a drive signal for the GOA circuit 1. Specifically, the drive chip 2 may comprise a first drive signal pin 21 for driving the first scanning GOA circuit 11, a second drive signal pin 22 for driving the second scanning GOA circuit 12, and a third drive signal pin 23 for driving the transmitting GOA circuit 13. The first drive signal pin 21 and the second drive signal pin 22 may be disposed at two sides of a side edge of the drive chip 2 that is close to the effective display region AA, and the third drive signal pin 23 may be disposed at a middle position of the side edge of the drive chip 2 that is close to the effective display region.

In this embodiment, the display panel 100 and the effective display region AA may be disposed to be rectangular, and four corner positions of the display panel 100 and the effective display region AA may be right-angled.

Figure 2:
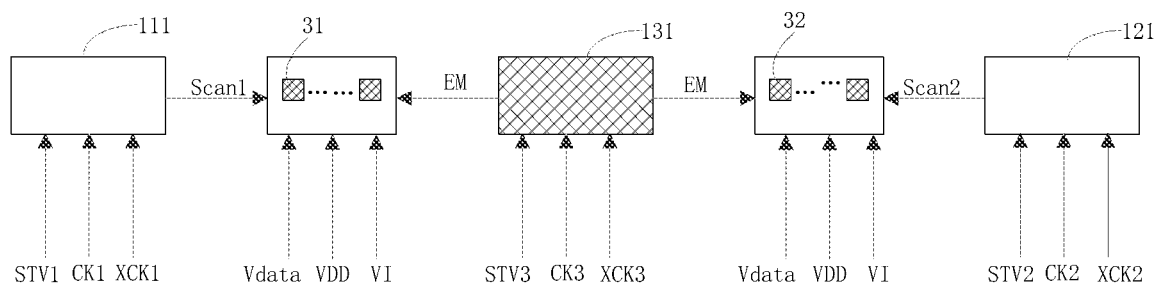
FIG. 2 is a schematic view of a BB area of the AMOLED display panel shown in FIG. 1.

Please refer to FIG. 2 together, and FIG. 2 is a schematic view of a BB area of the AMOLED display panel shown in FIG. 1. As shown hi FIG. 2, the first scanning GOA circuit 11, the second scanning GOA circuit 12 and the transmitting GOA circuit 13 may respectively comprise a plurality of first scanning units 111, a plurality of second scanning units 121 and a plurality of transmitting units 131 that are connected in cascade and disposed corresponding to each row of the pixel unit 3.

The first scanning unit 111 may provide a first scanning signal Scan1 to a first pixel 31 in each row of the pixel units 3, the second scanning unit 121 may provide a second scanning signal Scan2 to a second pixel 32 in each row of the pixel units 3, and the transmitting unit 13 may provide a transmitting signal EM to the first pixel 31 and the second pixel 32 in each row of the pixel units 3.

In this embodiment, the first pixel 31 and the second pixel 32 may be respectively the left-side and the right-side pixel unit 3 divided by a dividing line parallel to a long side of the effective display region AA. The first pixel 31 and the second pixel 32 form a row of pixel units 3, and the number of the first pixels 31 may be the same as or different from the number of the second pixels 32.

The first scanning signal Scan1 and the second scanning signal Scan2 may be configured to turn on the thin film transistor of the corresponding pixel unit 3 at a certain period of time so that the pixel unit 3 may scan a data signal Vdata into the capacitor of the pixel unit 3 for storage. The first scanning signal Scan1 and the second scanning signal Scan2 may also be configured to initialize the potential of the capacitor or initialize the anode of the pixel unit 3. The transmitting signal EM may be configured to enable the accurate read-in of the data signal Vdata and inhibit the pixel unit 3 from emitting light during the process of data reading-in and initializing when the first scanning signal Scan1 and the second scanning signal Scan2 turn on the thin film transistor of the corresponding pixel unit 3.

In this embodiment, the first driving signal pin 21 may provide a first clock signal XCK1, a second clock signal CK1 and a start signal STV1 for driving the first scanning GOA circuit 11, i.e., the plurality of a first scanning unit 111, wherein the first scanning GOA circuit 11 may generate the first scanning signal Scan1 when being driven by the first clock signal XCK1, the second clock signal CK1 and the start signal STV1. The second driving signal pin 22 may provide a first clock signal XCK2, a second clock signal CK2 and a start signal STV2 for driving the second scanning GOA circuit 12, i.e., the plurality of second scanning unit 121, wherein the second scanning GOA circuit 12 may generate the second scanning signal Scan2 when being driven by the first clock signal XCK2, the second clock signal CK2 and the start signal STV2. The third driving signal pin 23 may provide a first clock signal XCK3, a second clock signal CK3 and a start signal STV3 for driving the transmitting GOA circuit 13, i.e., the plurality of transmitting units 131, wherein the transmitting GOA circuit 13 may generate the transmitting signal EM when being driven by the first clock signal XCK3, the second clock signal CK3 and the start signal STV3.

In this embodiment, the display panel 100 may further comprise a power signal VDD and a start signal V1 for driving the pixel unit 3, wherein the start signal V1 may be configured to initialize the pixel unit 3, and the power signal VDD may be configured to provide voltage for the pixel unit 3.

Figure 3:
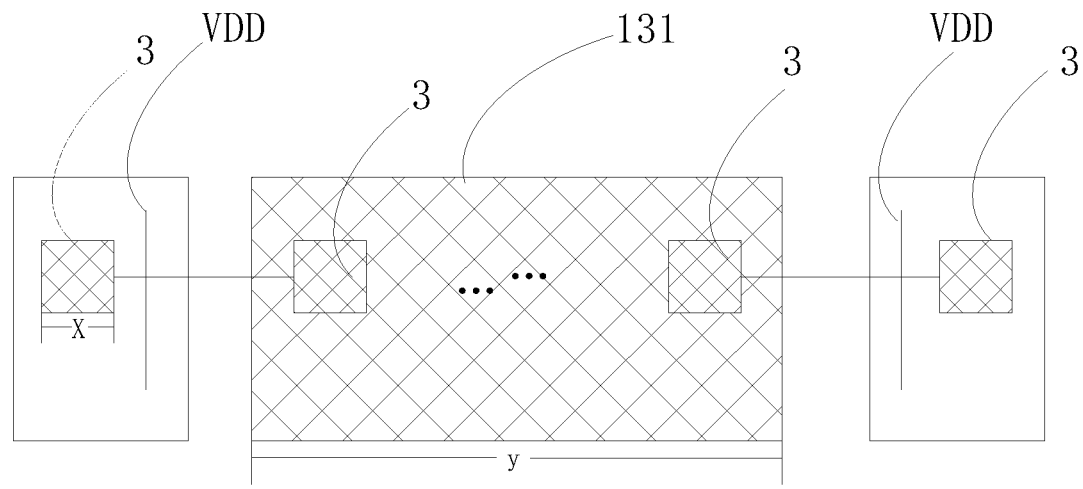
FIG. 3 is a schematic view of a CC area of the AMOLED display panel shown in FIG. 1.

Please refer to FIG. 3 together, and FIG. 3 is a schematic view of a CC area of the AMOLED display panel shown in FIG. 1. As shown in FIG. 3, when the width of the pixel unit 3 is x and the width of the transmitting GOA circuit 13 is y, the minimum repeat unit of the pixel unit 3 may be y/x in the direction parallel to the width of the transmitting GOA circuit 13 in the effective display region AA above the transmitting GOA circuit 13, wherein y/x may be greater than or equal to 1. That is, at least one pixel unit 3 may be disposed on the transmitting GOA circuit 13. Because the pixel unit 3 is self-luminous, the transmitting GOA circuit 13 disposed below the effective display region AA will not influence the normal light emitting and displaying of the effective display region AA and will not cause loss of the displaying quality.

In this embodiment, in each row of the pixel unit, the pixel unit 3 disposed above the transmitting GOA circuit 13 and the adjacent pixel unit 3 may not disposed above the transmitting GOA circuit 13 may share the power signal VDD so that the pixel unit 3 disposed above the transmitting GOA circuit 13 can emit light.

Figure 4:
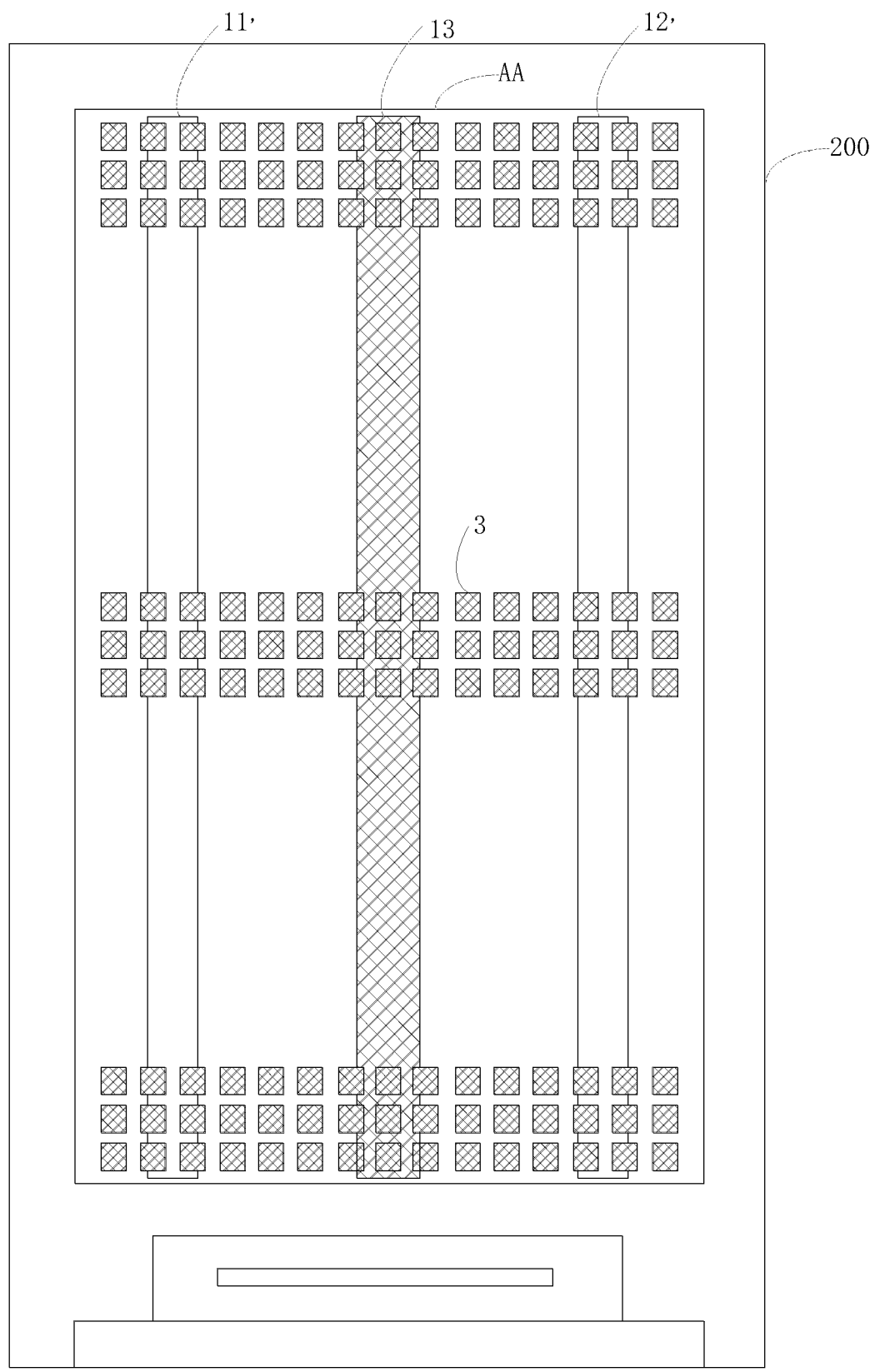
FIG. 4 is a schematic structural view of an AMOLED display panel according to a second embodiment of the present disclosure.

FIG. 4 is a schematic structural view of an AMOLED display panel according to a second embodiment of the present disclosure. A display panel 200 of FIG. 4 differs from the display panel 100 of FIG. 1 in that: the first scanning GOA circuit 11' and the second scanning GOA circuit 12' may be disposed below the effective display region AA and may be completely covered by the effective display region 4.

In this embodiment, the first scanning GOA circuit 11' and the second scanning GOA circuit 12' may be disposed to be rectangular, and the first scanning GOA circuit 11' and the second scanning GOA circuit 12' may be disposed symmetrically with respect to the central axis of the transmitting GOA circuit 13.

In this embodiment, the first scanning GOA circuit 11', the second scanning GOA circuit 12' and the transmitting GOA circuit 13 may have the same length, and the width of the first scanning GOA circuit 11' and the second scanning GOA circuit 12' may be the same and may be smaller than or equal to the width of the transmitting GOA circuit 13.

In this embodiment, at least one pixel unit 3 may be disposed on the effective display region AA above the first scanning GOA circuit 11' and the second scanning GOA circuit 12'. Because the pixel unit 3 is self-luminous, the first scanning GOA circuit 11' and the second scanning GOA circuit 12' disposed below the effective display region AA will not influence the normal light emitting and displaying of the effective display region AA and will not cause loss of the displaying quality.

In this embodiment, in each row of the pixel unit, the pixel unit 3 disposed above the first scanning GOA circuit 11' and the adjacent pixel unit 3 not disposed above the first scanning GOA circuit 11' may share the power signal VDD so that the pixel unit 3 disposed above the first scanning GOA circuit 11' can emit light. Additionally, the second scanning GOA circuit 12' may be disposed in the same manner.

As shall be appreciated by those skilled in the art, in other embodiments, the first scanning GOA circuit 11' and the second scanning GOA circuit 12' may also be disposed asymmetrically with respect to the central axis of the transmitting GOA circuit 13. For example, the first scanning GOA circuit 11' is disposed close to the transmitting GOA circuit 13, and the second scanning GOA circuit 12' is disposed away from the transmitting GOA circuit 13 so that the first scanning GOA circuit 11' is disposed below the effective display region AA and the second scanning GOA circuit 12' is disposed in an edge area outside the effective display region AA.

Figure 5:
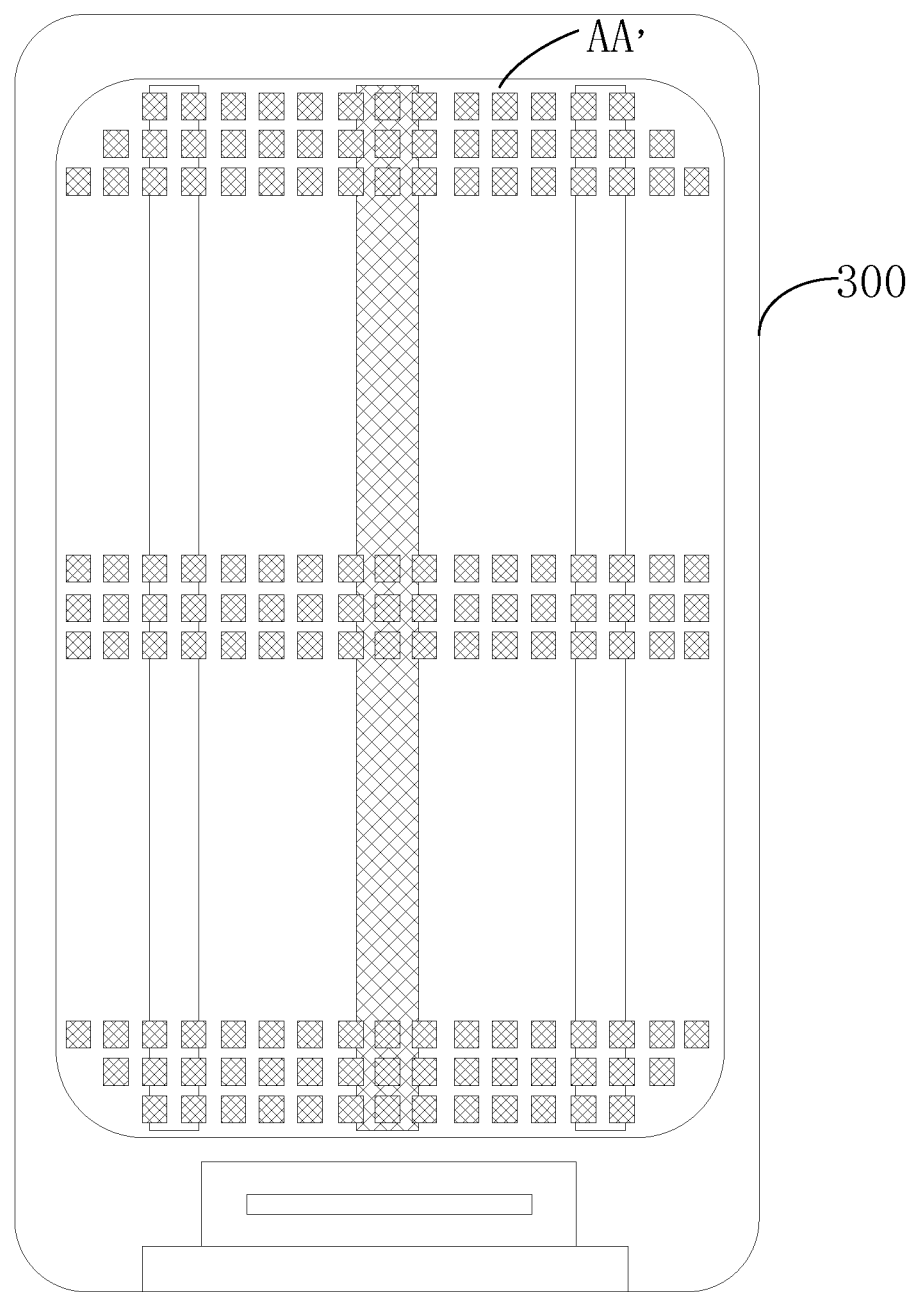
FIG. 5 is a schematic structural view of an AMOLED display panel according to a third embodiment of the present disclosure.

FIG. 5 is a schematic structural view of an AMOLED display panel according to a third embodiment of the present disclosure. A display panel 300 of FIG. 5 differs from the display panel 200 of FIG. 4 in that: the display panel 300 and the effective display region AA' may be disposed to be rectangular, and four corner positions of the display panel 300 and the effective display region AA' may be rounded.

In this embodiment, the number of the pixel units in each of the rows located in the rounded area may be different from each other and may be smaller than the predetermined number of the pixel units in each of the rows of the display panel. The predetermined number of the pixel units in each of the rows may be the number of the pixel units in each of the rows located in the middle area of the display panel.

In this embodiment, because the GOA circuit is disposed below the effective display region AA' and is completely covered by the effective display region AA', it is unnecessary to consider the issue regarding the round-corner arrangement of the GOA circuit when the effective display region AA' adopts the round-corner arrangement, which makes it easier to achieve the round-corner arrangement of the display panel.

Benefits of the present disclosure are as follows: the AMOLED display panel of the present disclosure may comprise a GOA circuit and an effective display region; wherein the GOA circuit may comprise a transmitting GOA circuit, and the transmitting GOA circuit may be disposed below the effective display region and may be completely covered by the effective display region. In this way, the present disclosure disposes the transmitting GOA circuit below the effective display region, and the left and the right sides outside the effective display region do not need to be provided with the transmitting GOA circuit, thereby remarkably reducing the width of the left and the right bezels of the AMOLED display panel and obtaining a display panel with narrow bezels and a high pixels per inch (PPI).

What described above are only the embodiments of the present disclosure, but are not intended to limit the scope of the present disclosure. Any equivalent structures or equivalent process flow modifications that are made according to the specification and the attached drawings of the present disclosure, or any direct or indirect applications of the present disclosure in other related technical fields shall all be covered within the scope of the present disclosure.

What is claimed is:

1. An AMOLED display panel, comprising a GOA circuit and an effective display region;
   wherein the GOA circuit comprises a transmitting GOA circuit, the transmitting GOA circuit being disposed below the effective display region and completely covered by the effective display region;
   wherein the GOA circuit further comprises a first scanning GOA circuit and a second scanning GOA circuit;
   wherein the first scanning GOA circuit, the second scanning GOA circuit and the transmitting GOA circuit are disposed in parallel, the first scanning GOA circuit and the second scanning GOA circuit are respectively disposed in edge areas at two sides outside the effective display region or disposed below the effective display region and the first scanning GOA circuit and the second scanning GOA circuit completely covered by the effective display region;
   wherein the display panel further comprises multiple rows of pixel units disposed on the effective display region;
   the first scanning GOA circuit, the second scanning GOA circuit and the transmitting GOA circuit comprise a first scanning unit, a second scanning unit and a transmitting unit disposed corresponding to each row of the pixel units;
   wherein the first scanning unit provides a first scanning signal to a first pixel in each row of the pixel units, the second scanning unit provides a second scanning signal to a second pixel in each row of the pixel units, and the transmitting unit provides a transmitting signal to the first pixel and the second pixel in each row of the pixel units;
   the display panel further comprises a power signal for driving the pixel units;

wherein in each row of the pixel units, the pixel unit disposed above the transmitting GOA circuit and the adjacent pixel unit not disposed above the transmitting GOA circuit share the power signal.

2. The display panel of claim 1, wherein the panel further comprises a drive chip providing a drive signal for the GOA circuit;

the drive chip is disposed perpendicular to the transmitting GOA circuit, and the drive chip is disposed at an edge area outside the effective display region.

3. The display panel of claim 2, wherein the drive chip comprises a first drive signal pin for driving the first scanning GOA circuit, a second drive signal pin for driving the second scanning GOA circuit, and a third drive signal pin for driving the transmitting GOA circuit;

wherein the first drive signal pin and the second drive signal pin are disposed at two sides of a side edge of the drive chip that is close to the effective display region, and the third drive signal pin is disposed at a middle position of the side edge of the drive chip that is close to the effective display region.

4. The display panel of claim 1, wherein the first scanning GOA circuit, the second scanning GOA circuit and the transmitting GOA circuit are disposed to be rectangular.

5. The display panel of claim 4, wherein the first scanning GOA circuit, the second scanning GOA circuit and the transmitting GOA circuit have the same length, and the width of the first scanning GOA circuit and the second scanning GOA circuit is the same and the width of the first scanning GOA circuit and the second scanning GOA circuit are smaller than or equal to the width of the transmitting GOA circuit.

6. The display panel of claim 1, wherein the effective display region is disposed to be rectangular, and four corner positions of the effective display region are right-angled or rounded.

* * * * *